United States Patent
Kondo et al.

(10) Patent No.: US 7,323,238 B2
(45) Date of Patent: Jan. 29, 2008

(54) PRINTED CIRCUIT BOARD HAVING COLORED OUTER LAYER

(75) Inventors: Koji Kondo, Toyohashi (JP); Ryohei Kataoka, Okazaki (JP); Tomohiro Yokochi, Kariya (JP); Makoto Nakagoshi, Kanagawa (JP); Tadashi Murai, Kanagawa (JP); Akimori Hayashi, Kanagawa (JP); Katsunobu Suzuki, Kanagawa (JP)

(73) Assignees: DENSO Corporation, Kariya (JP); NEC Electronics Corporation, Kanagawa-pref. (JP)

( * ) Notice: Subject to any disclaimer, the term of this patent is extended or adjusted under 35 U.S.C. 154(b) by 57 days.

(21) Appl. No.: 11/232,078

(22) Filed: Sep. 22, 2005

(65) Prior Publication Data

US 2006/0068180 A1 Mar. 30, 2006

(30) Foreign Application Priority Data

Sep. 24, 2004 (JP) ............................. 2004-277790

(51) Int. Cl.
*B32B 3/00* (2006.01)
(52) U.S. Cl. ................... 428/209; 174/258; 257/729
(58) Field of Classification Search ............... 428/209; 174/255, 258; 257/729
See application file for complete search history.

(56) References Cited

U.S. PATENT DOCUMENTS

| | | | | |
|---|---|---|---|---|
| 4,283,480 A | * | 8/1981 | Davies et al. ............. | 430/270.1 |
| 4,409,077 A | * | 10/1983 | Sakiyama et al. ........... | 522/167 |
| 4,497,889 A | * | 2/1985 | Fuerniss ................... | 430/260 |
| 5,153,051 A | * | 10/1992 | Dorinski .................. | 428/209 |
| 5,268,255 A | * | 12/1993 | Kikuchi et al. ........... | 430/280.1 |
| 5,402,314 A | * | 3/1995 | Amago et al. .............. | 361/760 |
| 6,156,414 A | * | 12/2000 | Shimoto et al. ............ | 428/209 |
| 6,174,562 B1 | * | 1/2001 | Bergstedt ................. | 430/314 |
| 6,201,305 B1 | * | 3/2001 | Darveaux et al. ........... | 257/779 |
| 6,228,466 B1 | * | 5/2001 | Tsukada et al. ............ | 428/209 |
| 6,303,878 B1 | * | 10/2001 | Kondo et al. .............. | 174/261 |
| 6,380,633 B1 | * | 4/2002 | Tsai ........................ | 257/778 |
| 6,667,443 B2 | | 12/2003 | Kondo et al. | |
| 6,734,570 B1 | * | 5/2004 | Archer ..................... | 257/786 |
| 6,849,805 B2 | * | 2/2005 | Honda et al. .............. | 174/250 |
| 6,855,625 B2 | | 2/2005 | Kondo et al. | |
| 6,855,892 B2 | | 2/2005 | Komatsu et al. | |
| 7,070,207 B2 | * | 7/2006 | Asai ........................ | 285/14 |
| 2004/0037966 A1 | | 2/2004 | Yokochi et al. | |

FOREIGN PATENT DOCUMENTS

| | | |
|---|---|---|
| JP | B2-6-20087 | 3/1994 |
| JP | A-10-51104 | 2/1998 |
| JP | A-2003-60348 | 2/2003 |

OTHER PUBLICATIONS

Notice of Preliminary Rejection from Korean Patent Office issued on Nov. 13, 2006 for the corresponding Korean patent application No. 10-2005-0088958 (a copy and English translation thereof).

* cited by examiner

*Primary Examiner*—Cathy F. Lam
(74) *Attorney, Agent, or Firm*—Posz Law Group, PLC

(57) ABSTRACT

In a printed board having a land as an electrode, a colored thermoplastic resin film is arranged on a land forming surface of a thermoplastic resin member so as to set a difference in light reflectivity between the land and the colored thermoplastic resin film, to be greater than that between the land and the thermoplastic resin member. An opening portion is provided in the colored thermoplastic resin film so that at least a part of the land is exposed from the opening portion. Because the colored thermoplastic resin film is positioned on the circumference portion of the opening portion, the difference in light reflectivity of the land with respect to its circumference portion can be effectively increased. As a result, a recognition ratio of the land can be effectively improved.

14 Claims, 6 Drawing Sheets

PRINTED CIRCUIT BOARD HAVING COLORED OUTER LAYER

CROSS REFERENCE TO RELATED APPLICATION

This application is based on Japanese Patent Application No. 2004-277790 filed on Sep. 24, 2004, the contents of which are incorporated herein by reference in its entirety.

FIELD OF THE INVENTION

The present invention relates to a printed board having a land as an electrode on a surface of a thermoplastic resin member, and a manufacturing method of the printed board.

BACKGROUND OF THE INVENTION

For example, JP-A-2003-60348 discloses a printed board, which has lands as electrodes connected to an electronic part on a surface of a thermoplastic resin member.

In this printed board, plural one-face conductor pattern films are laminated. Each of the one-face conductor pattern films has a conductor pattern on one face of a resin film formed from a thermoplastic resin. The resin films are bonded to each other by heating this laminating body while pressuring this laminating body by using a hot press machine from above and below. Only the lands (electrode portion) are arranged as a conductor pattern on a substrate surface. The electronic part can be mounted to the lands through solder, etc. without forming a solder resist on the substrate surface except for the lands.

In the mounting of the electronic part, each land is optically recognized on the basis of the difference in intensity of reflected light between the land on the printed board surface and the resin in a circumferential portion of the land, and the electronic part is mounted. Accordingly, it is required that the difference in light reflectivity between the land and the resin of its circumferential portion is large.

However, in the printed board of the above structure, because the difference in intensity of the reflected light between the land and the resin in the circumferential portion of the land is small (contrast is low), the recognition ratio of the land is low.

SUMMARY OF THE INVENTION

In view of the above-described problems, it is an object of the present invention to provide a printed board able to improve a recognition ratio of a land in a case where the printed board is constructed with a thermoplastic resin member.

It is another object of the present invention to provide a method of manufacturing a printed board having a thermoplastic resin member.

According to an aspect of the present invention, a printed board includes a thermoplastic resin member, a land as an electrode provided on a land forming surface of the thermoplastic resin member, and a thermoplastic resin film colored so as to set a difference in light reflectivity between the land and the thermoplastic resin film to be greater than that between the land and the thermoplastic resin member. Furthermore, the thermoplastic resin film is arranged on the land forming surface of the thermoplastic resin member, and the thermoplastic resin film has an opening portion from which at least a part of the land is exposed.

Accordingly, when the printed board is viewed from above the land forming face, the colored thermoplastic resin film can be arranged in the circumferential portion of the land. Because the difference in intensity of the reflected light between the land and its circumferential portion becomes larger, a recognition ratio of the land can be improved in the printed board constructed with the thermoplastic resin.

An opening portion is provided in the colored thermoplastic resin film, and a circuit portion is not arranged on the land forming surface. Accordingly, the structure can be simplified. Further, even when a reduction in relative dielectric constant and a reduction in melting point of the thermoplastic resin film is changed by the coloring, for example, it is possible to minimize an influence affecting the circuit portion because no circuit portion is directly arranged.

A conductor pattern can be arranged in the thermoplastic resin member and can be electrically connected to the land. Further, the thermoplastic resin film can be a colored film of a thermoplastic resin that is the same material as the thermoplastic resin member.

According to another aspect of the present invention, a printed board includes a thermoplastic resin member which is formed from a plurality of stacked thermoplastic resin films, a plurality of conductor patterns arranged in the thermoplastic resin member in a multi-layer, and a land as an electrode provided on a land forming surface of one thermoplastic resin film among the stacked thermoplastic resin films. Furthermore, the one thermoplastic resin film is colored so as to set a difference in light reflectivity between the land and the one thermoplastic resin film, to be greater than that between the land and other thermoplastic resin films except for the one thermoplastic resin film. Therefore, the recognition ratio of the land can be improved in the printed board constructed with the thermoplastic resin.

For example, the land forming surface of the one thermoplastic resin film can be arranged as a surface layer of the stacked thermoplastic resin films, and the land can be exposed from the surface of the one thermoplastic resin film. Further, a light transmitting film, made of a thermoplastic resin and having a light transmittance higher than that of the thermoplastic resin films, can be arranged to contact the land forming surface of the one thermoplastic resin film. In this case, the light transmitting film has an opening portion from which at least a part of the land is exposed.

The one thermoplastic resin film is a colored film formed by coloring a thermoplastic resin film made of the same material as the thermoplastic resin films except for the one thermoplastic resin film, for example. More specifically, the colored thermoplastic resin film is composed by adding a colored inorganic pigment to the thermoplastic resin. As an example, the inorganic pigment is black such as carbon black. Further, an amount of the carbon black included in the colored thermoplastic resin film can be set in a range between 0.01 weight % and 1.0 weight %.

According to another aspect of the present invention, a manufacturing method of a printed board includes: a step of forming a land as an electrode on a land forming surface of a first resin film made of a thermoplastic resin material; a step of preparing a second resin film made of a colored thermoplastic resin material in which a colored inorganic pigment is added; a step of stacking the second resin film on the land forming surface of the first resin film at a predetermined position to form a stacked member; a step of pressing and heating the stacked member of the first resin film and the second resin film by using a hot press machine, so as to bond the first resin film and the second resin film to each other; and a step of forming an opening portion in the second resin film at a position of the land so as to expose at least a part of the land from the opening portion. In this case, the forming step of the opening portion can be performed after the pressing and heating step. Alternatively, the forming step of the opening portion can be performed during the preparing step of the second resin film.

According to another aspect of the present invention, a method of manufacturing a printed board includes: a step of forming a first resin film made of a thermoplastic resin material; a step of forming a land as an electrode on a land forming surface of a second resin film made of a thermoplastic resin material in which a colored inorganic pigment is added so as to set a difference in light reflectivity of the land with respect to the second resin film to be greater than a difference in light reflectivity of the land with respect to the first resin film; and a step of stacking plural resin films made of thermoplastic resin, including the first resin film and the second resin film to form a stacked member. In the step of stacking the plural resin film, the first resin film contacts a surface of the second resin film, opposite to the land forming surface. Furthermore, pressing and heating of the staked member can be performed by using a hot press machine, so that the stacked resin films are bonded to each other.

In this case, the stacking step can be performed while the second resin film is positioned on a surface of the stacked member, so that the land is exposed from the surface of the stacked member. Alternatively, in the stacking step, one resin film having a light transmittance higher than that of the second resin film can be stacked to contact the land forming surface of the second resin film. Even in this case, an opening portion can be formed in the one resin film to expose a part of the land from the opening portion.

Further, the forming step of the opening portion can be performed after the pressing and heating of the stacked member is performed, or can be performed before the stacking is performed.

BRIEF DESCRIPTION OF THE DRAWINGS

The above and other objects, features and advantages of the present invention will become more apparent from the following detailed description of preferred embodiments made with reference to the accompanying drawings, in which:

FIGS. 3A to 3D are schematic sectional views showing an example of a manufacturing method of a printed board according to the first embodiment, in which FIG. 3A shows a land forming step, FIG. 3B shows a laminating step, FIG. 3C shows a pressing-heating step, and FIG. 3D shows an opening portion forming step;

FIGS. 4A to 4D are schematic sectional views showing another example of a manufacturing method of a printed board according to the first embodiment, in which FIG. 4A shows a land forming step, FIG. 4B shows an opening portion forming step, FIG. 4C shows a laminating step, and FIG. 4D shows a pressing-heating step;

FIGS. 7A to 7C are schematic sectional views showing the manufacturing method of the printed board according to the second embodiment, in which FIG. 7A shows a laminating step, FIG. 7B shows a pressing-heating step, and FIG. 7C shows an opening portion forming step.

DETAILED DESCRIPTION OF PREFERRED EMBODIMENTS

First Embodiment

Figure 1:
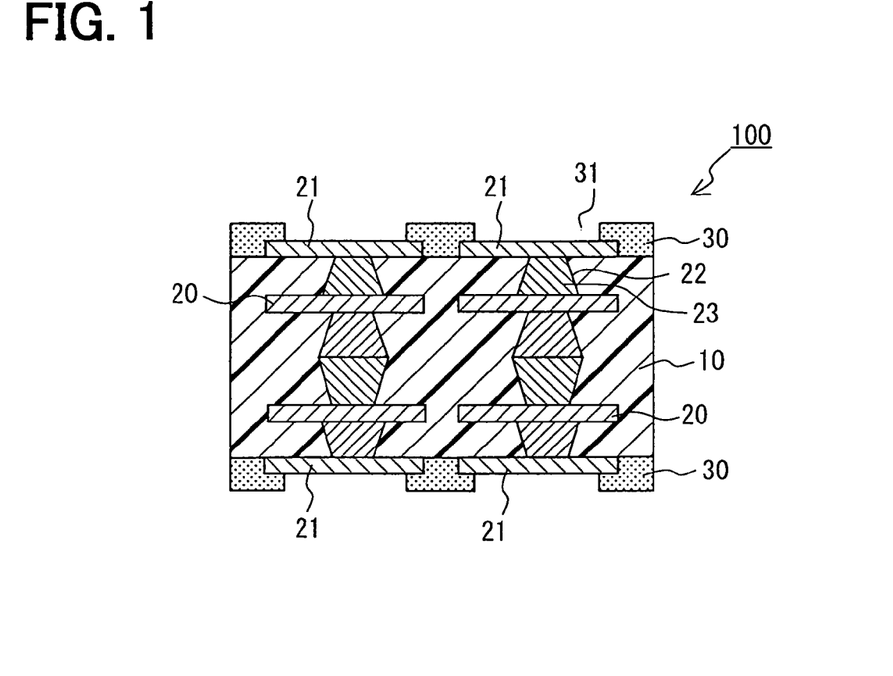
FIG. 1 is a schematic sectional view of a printed board according to a first embodiment of the present invention.

As shown in FIG. 1, a printed board 100 in this embodiment is constructed with a thermoplastic resin member 10, conductor patterns 20, and coloring films 30 formed from coloring thermoplastic resin as a characteristic portion in this embodiment. In this embodiment, an electrode portion of a substrate surface layer for mounting a discrete part and an electronic part such as an IC, etc. in conductor patterns are shown as lands 21, and a portion except for this electrode portion in the conductor patterns is shown as the conductor pattern 20. Further, each coloring film 30 is a colored thermoplastic resin film, for example.

The material of the thermoplastic resin member 10 is not particularly limited if this material is a thermoplastic resin material. For example, the thermoplastic resin member 10 in this embodiment can be formed by laminating plural (four in this example) resin films constructed with a liquid crystal polymer (LCP) of about 50 μm in thickness, and bonding (melting) these resin films to each other.

The conductor patterns 20 are laminated and arranged in the thermoplastic resin member 10 in a multi-layer. The lands 21 as electrodes for mounting electronic parts can be formed on the surface of the thermoplastic resin member 10. The conductor patterns 20 of the respective layers and the lands 21 are electrically connected to each other by interlayer connecting materials 23 filled within via holes 22. The printed board 100 in this embodiment has a structure having the lands 21 on both the surfaces of the thermoplastic resin member 10, and both the lands 21 on both the surfaces of the thermoplastic resin member 10 are electrically connected to each other.

The unillustrated conductor pattern can be also formed on the surface of the thermoplastic resin member 10 except for the land 21. Materials of the conductor patterns 20 and the lands 21 are not particularly limited if these materials are low resistance metallic materials. In this embodiment, the conductor pattern 20 and the land 21 can be formed by processing a Cu foil.

Here, binarization using image processing is general as an optical means used when the electronic part is mounted to the land 21. In this embodiment, the land 21 and its circumferential portion are binarized and processed in 256 gradations by the image processing, and the land 21 is recognized. However, in the case of an optical recognizing method as in the image processing, when the printed board 100 is constructed with generally known thermoplastic resin, the difference in intensity of reflected light (difference in light reflectivity) between the land 21 and the thermoplastic resin of the circumferential portion of the land 21 is small. Therefore, the contrast of the land 21 and the circumferential portion becomes unclear. Therefore, there is a case in which no land 21 can be precisely recognized.

Accordingly, in this embodiment, the coloring films 30 formed from a coloring thermoplastic resin are laminated and arranged on the land forming faces of the thermoplastic resin member 10 so as to set the difference in light reflectivity with respect to the land 21 to be greater than the difference in light reflectivity between the thermoplastic resin member 10 and the land 21.

This coloring film 30 is formed by adding a colored inorganic pigment to thermoplastic resin. If the inorganic pigment is thus used, it is suitable to color the thermoplastic resin film because the inorganic pigment has a melting point higher than a heating temperature at a forming time of the printed board 100 (excellent in heat resisting property), and is not thermally deteriorated. Because the inorganic pigment is not thermally deteriorated, the color can be held. A black inorganic pigment having a highest light absorption ratio (i.e., the difference in light reflectivity with respect to the land 21 can be set to be large) is particularly more preferable. In this embodiment, similar to the thermoplastic resin member 10, for example, the coloring film 30 can be formed by adding carbon black as the black inorganic pigment to LCP of about 50 µm in thickness, for example. However, no colored inorganic pigment is limited to black, but a colored inorganic pigment having a color of a high light absorption ratio (e.g., deep color) can be also applied. The coloring film 30 is formed by coloring thermoplastic resin, but hatching different from that of the thermoplastic resin member 10 is performed in FIG. 1 so as to distinguish the coloring film 30 and the thermoplastic resin member 10.

The coloring film 30 is laminated and arranged on the land forming face of the thermoplastic resin member 10, and is mutually bonded (melted) to the thermoplastic resin member 10. An opening portion 31 is arranged correspondingly to the land 21 so as to expose at least a part of the land 21. Accordingly, when each land 21 is seen from above the land forming face, each land 21 is surrounded by the coloring film 30, and the difference in light reflectivity between the land 21 and its circumferential portion (i.e., coloring film 30) is greater than the difference in light reflectivity between the land 21 and the thermoplastic resin member 10. As mentioned above, when the material of the coloring film 30 is the same as the material of the thermoplastic resin member 10, the connection reliability between the coloring film 30 and the thermoplastic resin member 10 can be improved.

Figure 2:
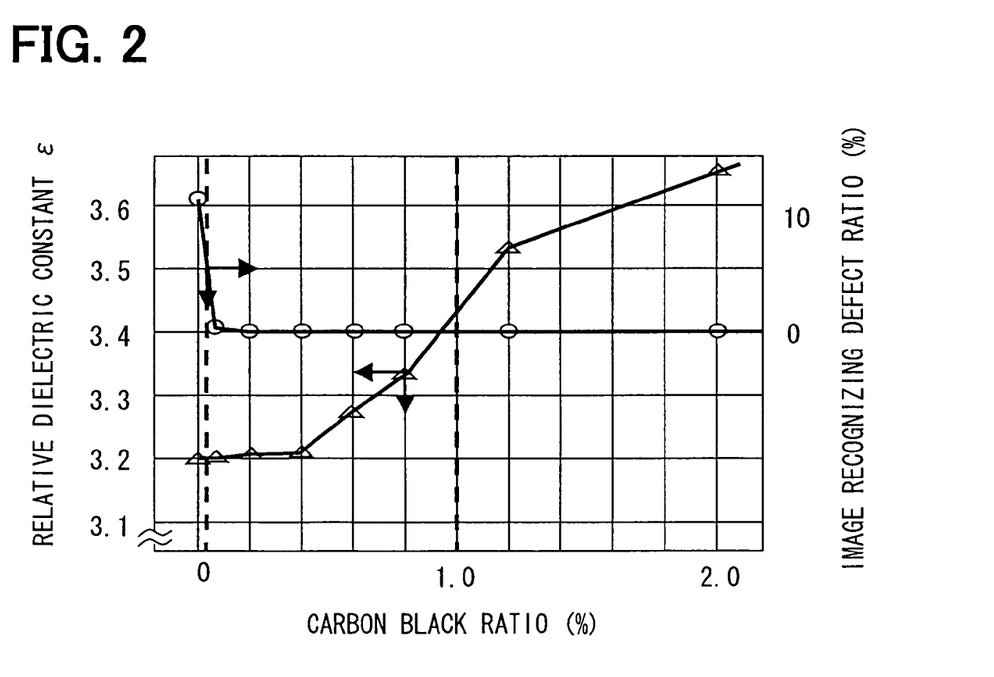
FIG. 2 is a graph showing a change in a relative dielectric constant of a coloring film and a change in an image recognizing ratio of a land with respect to a carbon black ratio included in a coloring film.

As shown in FIG. 2, the ratio of carbon black included in the coloring film 30 is preferably set in a range between 0.01 weight % or more and 1.0 weight % or less. FIG. 2 is a graph showing a change in the relative dielectric constant of the coloring film 30 with respect to the carbon black ratio included in the coloring film 30, and a change in an image recognizing defect ratio of the land 21.

For example, when the ratio of carbon black included in the coloring film 30 is set to be less than 0.01 weight %, the adding amount of carbon black is small and the light absorption ratio of the coloring film 30 is low. Therefore, it attains a state in which the image recognizing defect ratio of the land 21 is high (the recognizing ratio of the land 21 is low). In contrast to this, when the ratio of carbon black included in the coloring film 30 is set to 0.01 weight % or more, the light absorption ratio of the coloring film 30 is large. That is, the difference in light reflectivity with respect to the land 21 is increased so that the image recognizing defect ratio of the land 21 becomes 5% or less (a ratio half the image recognizing defect ratio before the addition or less).

When the including ratio is set to be greater than 1.0 weight %, the increase in the relative dielectric constant of the coloring film 30 exceeds 10%. In this case, dielectric loss is increased and high frequency characteristics of the printed board 100 are reduced. In contrast to this, when the including ratio is set to 1.0 weight % or less, the increase in the relative dielectric constant of the coloring film 30 can be restrained so as to be less than 10%.

Accordingly, when the ratio of carbon black included in the coloring film 30 is set in a range between 0.01 weight % or more and 1.0 weight % or less, the recognizing ratio of the land 21 can be improved and a printed board 100 having excellent high-frequency characteristics can be formed.

Thus, in accordance with the structure of the printed board 100 of this embodiment, when the printed board 100 is viewed from above the land forming face, the coloring film 30 constructed with the colored thermoplastic resin is arranged in the circumference portion of each land 21. Here, the colored thermoplastic resin is colored so as to set the difference in light reflectivity with respect to the land 21 to be greater, as compared with the thermoplastic resin member 10. Accordingly, for example, when light is irradiated from above the land forming face when an electronic part is mounted to the land 21, the difference in intensity of reflected light between the land 21 and its circumferential portion (i.e., coloring film 30) is large. Accordingly, the recognizing ratio of the land 21 can be improved when both the thermoplastic resin member 10 and the coloring film 30 are used.

Further, the opening portion 31 is merely provided in the coloring film 30, but the conductor pattern 20 including the land 21 and the via hole 22 filled with the interlayer connecting material 23 are not changed. Accordingly, the structure can be simplified.

The coloring film 30 is laminated and arranged on each land forming face of the thermoplastic resin member 10 so as to expose only the land 21. Accordingly, as shown in this embodiment, when the conductor pattern 20 is formed on the land forming face of the thermoplastic resin member 10 except for the land 21, the conductor pattern 20 can be also used as a solder resist.

Figure 3A:
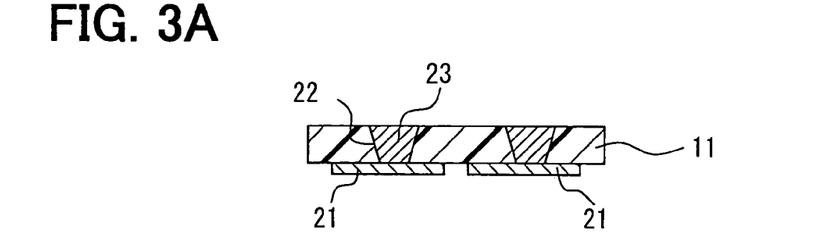
Figure 3B:
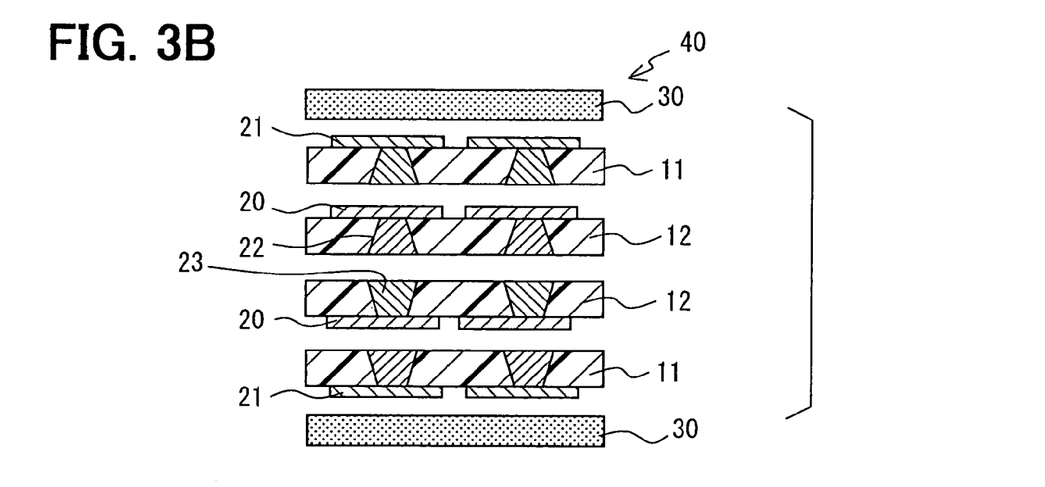
Figure 3C:
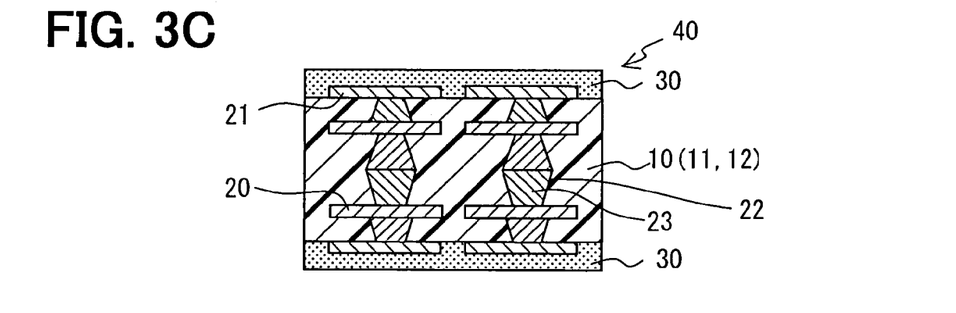
Figure 3D:
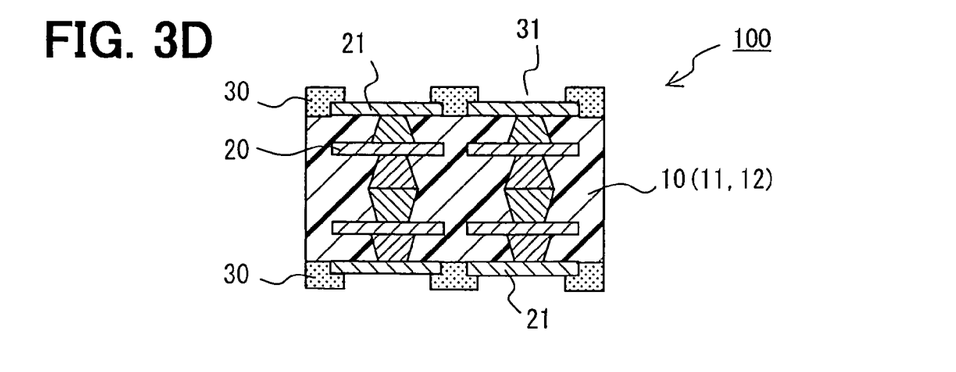

Next, a method of manufacturing the printed board 100 will be now described with reference to FIGS. 3A to 3D. FIG. 3A shows a land forming step, FIG. 3B shows a laminating step, FIG. 3C shows a pressing-heating step, and FIG. 3D shows an opening portion forming step.

As shown in FIG. 3A, a land forming step is first performed. Concretely, at least one resin film 11 made of a thermoplastic resin and having a conductor foil on one face is prepared. In this example of FIG. 3A, two resin films 11 are prepared so as to expose the lands 21 on both faces of the two resin film 11. At least the land 21 as an electrode is formed by etching the conductor foil in a predetermined desirable pattern. In this embodiment, LCP of 50 µm in thickness is used as the construction material of the resin film 11 and a Cu foil is used as the conductor foil. The land 21 may be also formed by using a printing method and a plating method in addition to the etching of the conductor foil.

After the land 21 is formed, as shown in FIG. 3A, for example, a carbon dioxide gas laser beam is irradiated from the rear face side of the land 21 to the resin film 11, and a via hole 22 having a bottom with the land 21 as a bottom face is formed. In the formation of the via hole 22, it is also possible to use a UV-YAG laser, an excimer laser, etc. in addition to the carbon dioxide gas laser. In addition to this, the via hole can be also mechanically formed by drill processing, etc. However, it is necessary to process the land 21 such that the via hole has a small diameter and no land 21 is damaged. Therefore, it is preferable to select a processing method using a laser.

When the formation of the via hole 22 is completed, the interior of the via hole 22 is filled with electrically conductive paste (23) as an interlayer connecting material 23. In this electrically conductive paste (23), tin particles and silver particles are mixed such that the tin particles occupy about 35 wt %, and an organic solvent (e.g., terpineol) is added and these particles are formed as paste. In the filling of the electrically conductive paste (23), it is possible to apply a screen printer, a dispenser, etc. When the tin particles and the silver particles having ranges of 0.5 to 20 μm in average particle diameter and 0.1 to 1.5 m$^2$/g in specific surface area are used, interlayer connection reliability can be improved. Further, after the electrically conductive paste 23 is filled within the via hole 22, the electrically conductive paste 23 is heated for a predetermined time and the organic solvent is dried.

Processing of a resin film 12 shown in FIG. 3B can be also performed while the processing of the resin film 11 is performed. This resin film 12 has a structure similar to that of the resin film 11, except that the conductor pattern 20 is formed on one face instead of the land 21. In this embodiment,. the thermoplastic resin member 10 is constructed with the resin films 11, 12.

Further, the coloring film 30 is separately prepared. In this embodiment, similar to the resin films 11, 12, the coloring film 30 is supplied in a state in which a predetermined amount of carbon black is added to LCP of 50 μm in thickness. This coloring film 30 is prepared by cutting the coloring film 30 to a size approximately equal to that of each of the resin films 11, 12.

As shown in FIG. 3B, two resin films 11, plural resin films 12 (two resin films 12 in this example) and two coloring films 30 are laminated so that a laminating body 40 is formed. At this time, the lamination is performed such that the coloring films 30 become both surface layers and the lands 21 contact the coloring films 30. Further, one face for forming the conductor pattern 20 and the land 21 is positioned on the upper side and one face for forming the conductor pattern 20 and the land 21 is positioned on the lower side, in the lamination. In FIG. 3B, for convenience, the respective films 11, 12, 30 are separately illustrated.

Thus, in this embodiment, both-face substrate is not used, a manufacturing equipment and a manufacturing process can be simplified, which can contribute to a reduction in manufacture cost. Further, because the lands 21 are exposed on both the upper and lower surfaces of the printed board 100, high density mounting or compactness of the printed board 100 can be performed. In addition to this, the lamination may be also performed so that the land 21 is exposed on only one surface of the laminating body 40.

After the laminating process, a pressurizing-heating step for heating the laminating body 40 while pressuring the laminating body 40 from both its upper and lower faces by an unillustrated hot press machine (e.g., 250 to 400° C., 1 to 10 MPa and several ten seconds) is performed. As a result, as shown in FIG. 3C, the respective resin films 11, 12, 30 are softened and bonded to each other so that the integrated laminating body 40 shown in FIG. 3C is formed. Further, the electrically conductive paste (23) within the via hole 22 is sintered so that an integrated electrically connecting material 23 is formed. Further, the electrically conductive paste (23) is further diffused and joined to the adjacent conductor pattern 20 and land 21. In this state, the land forming face including the land 21 of the resin film 11 is covered with the coloring film 30.

As shown in FIG. 3D, an opening portion forming step for forming the opening portions 31 in the coloring films 30 is performed via a cooling process after the hot press. For example, this opening portion 31 is formed correspondingly to the land 21 so as to expose only the land 21 by using a laser, a drill, etc. In this embodiment, the opening portion 31 is formed by using the laser so as not to damage the land 21, and no land 21 is perfectly exposed and its peripheral edge portion is pressed by the coloring film 30. In accordance with such a structure, separation of the land 21 from the resin film 11 can be effectively prevented. The printed board 100 in this embodiment can be formed by the above processes (steps).

In the embodiment of this embodiment, the printed board 100 is constructed with the two resin films 11, the two resin films 12 and the two coloring films 30. However, only when the printed board 100 is constructed so as to expose the lands 21 on both faces, the number of resin films 12 is not limited to the above example. Further, a structure for exposing the land 21 on only one face may be also set. In this case, a structure using one resin film 11 and one coloring film 30 can be set as a minimum structure.

Figure 4A:
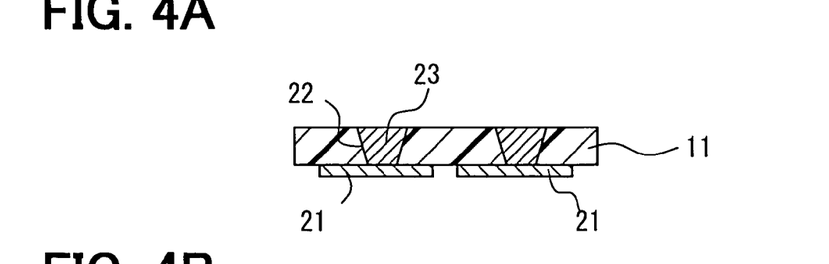
Figure 4B:
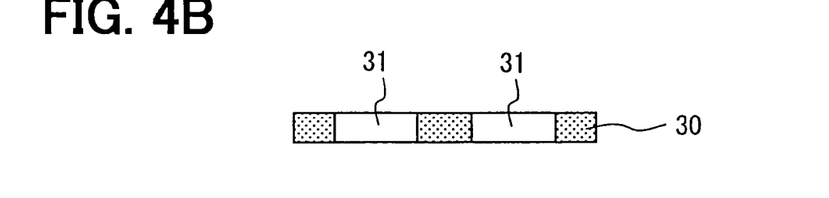
Figure 4C:
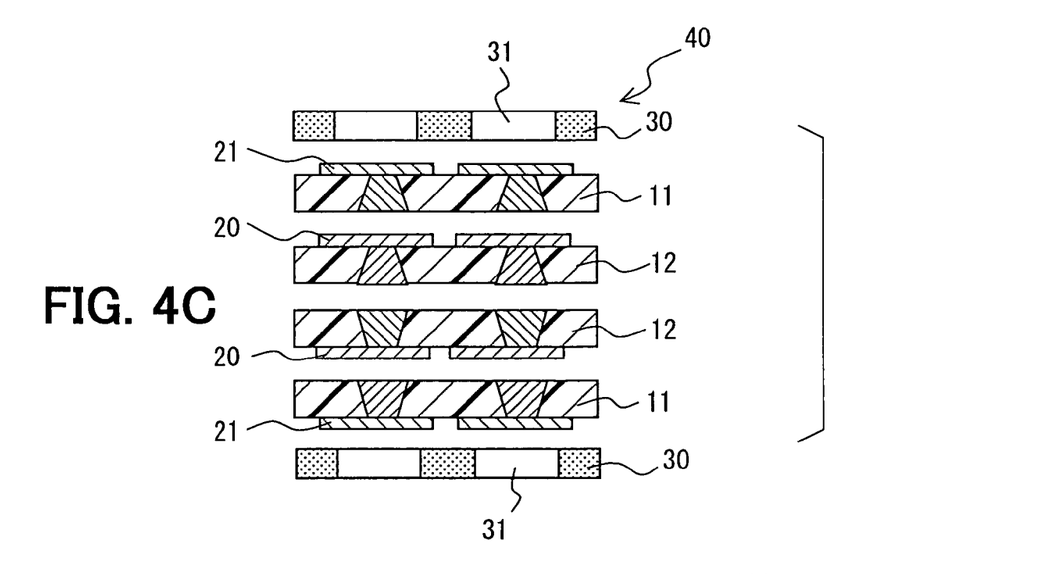
Figure 4D:
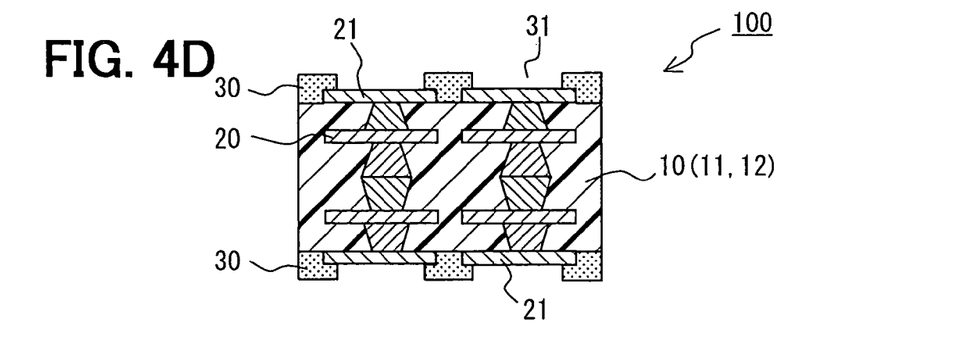

Further, this embodiment shows an example in which the opening portion forming step is performed after the pressurizing-heating process. However, as shown in FIGS. 4A to 4D, the opening portion forming step can be also performed before the laminating process. FIG. 4A shows a land forming step, FIG. 4B shows an opening portion forming step, FIG. 4C shows a laminating step, and FIG. 4D shows a pressing-heating step. FIG. 4A is a view corresponding to that of FIG. 3A.

As shown in FIG. 4B, the opening portion 31 can be formed in the coloring film 30 in a process for preparing the coloring film 30 before the laminating process. As shown in FIG. 4C, the laminating body 40 is then formed by laminating the films 11, 12, 30 including the coloring film 30 forming the opening portion 31 therein. As shown in FIG. 4D, the printed board 100 can be formed by pressurizing and heating the laminating body 40. Thus, when the opening portion 31 is formed before the laminating process, this opening portion 31 is easily formed because the opening portions 31 can be independently formed in the coloring film 30. However, because the pressuring-heating process is performed after the formation of the opening portion, no opening portion 31 is easily controlled in shape, size and forming position in comparison with the case in which the opening portion forming step is performed after the heating-pressurizing process.

Further, in this embodiment, the construction material of the coloring film 30 is the same as the construction material of the thermoplastic resin member 10. In this case, the connection reliability between the coloring film 30 and the thermoplastic resin member 10 can be improved. However, the coloring film 30 and the thermoplastic resin member 10 can be also constructed with different materials. Further, the resin films 11, 12 are not limited to the same material.

Further, this embodiment shows an example in which the laminating body 40 is formed by laminating the respective films 11, 12, 30 and these films are collectively bonded to each other by a hot press machine. In this case, the manufacturing process can be simplified. Further, it is possible to improve the connection reliability between the conductor pattern 20 including the land 21 and the interlayer connecting material 23 for connecting the conductor patterns 20 to each other. However, the printed board 100 may be also formed by divisionally performing the pressurization and the heating at plural times. For example, the pressurization and the heating can be performed every time when one film is laminated.

With respect to the structure and the manufacturing method except for the characteristic portions, it is possible to use a structure and a method relating to a multi-layer substrate (a printed board and a circuit substrate) composed of the thermoplastic resin.

Second Embodiment

The second embodiment differs from the first embodiment in that the land 21 is formed on the coloring film 30 before laminating.

Figure 5:
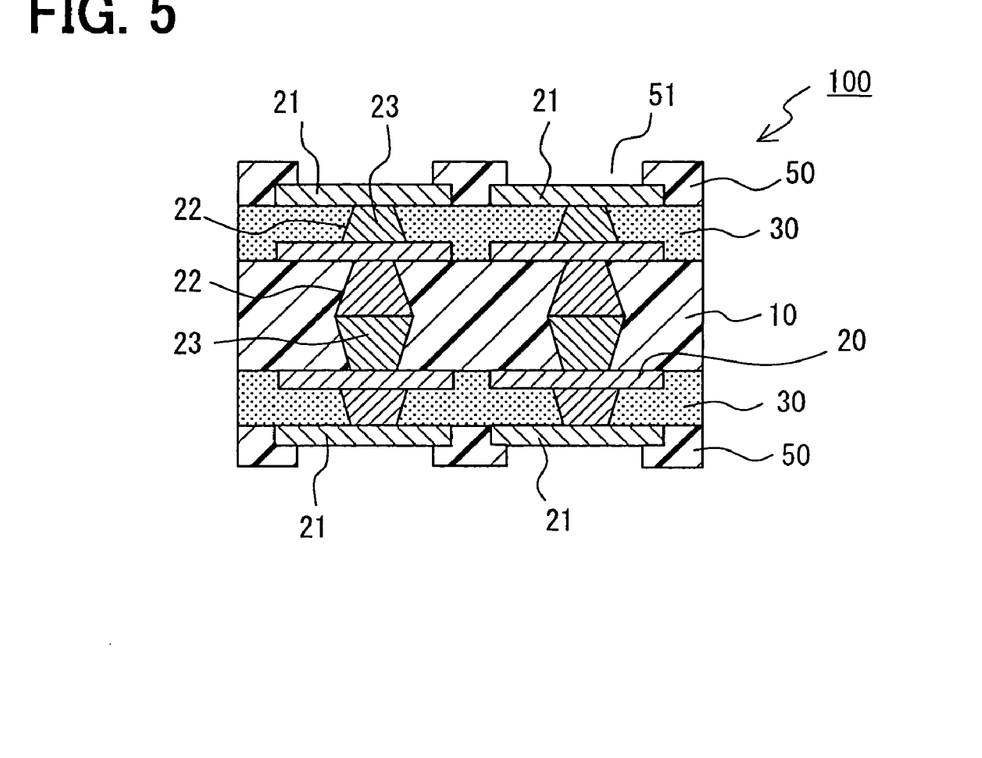
FIG. 5 is a schematic sectional view showing a printed board according to a second embodiment of the present invention.

FIG. 5 shows a schematic sectional view showing a printed board according to the second embodiment of the present invention. As shown in FIG. 5, a printed board 100 in this embodiment is constructed with thermoplastic resin member 10, conductor patterns 20, coloring films 30 formed by coloring thermoplastic resin, and transmitting films 50 having a light transmittance higher than that of the coloring film 30. In this embodiment, the thermoplastic resin member 10 and the coloring film 30 can be made of same thermoplastic resin or different thermoplastic resin. Only points different from those of the first embodiment will be mainly described.

Figure 6:
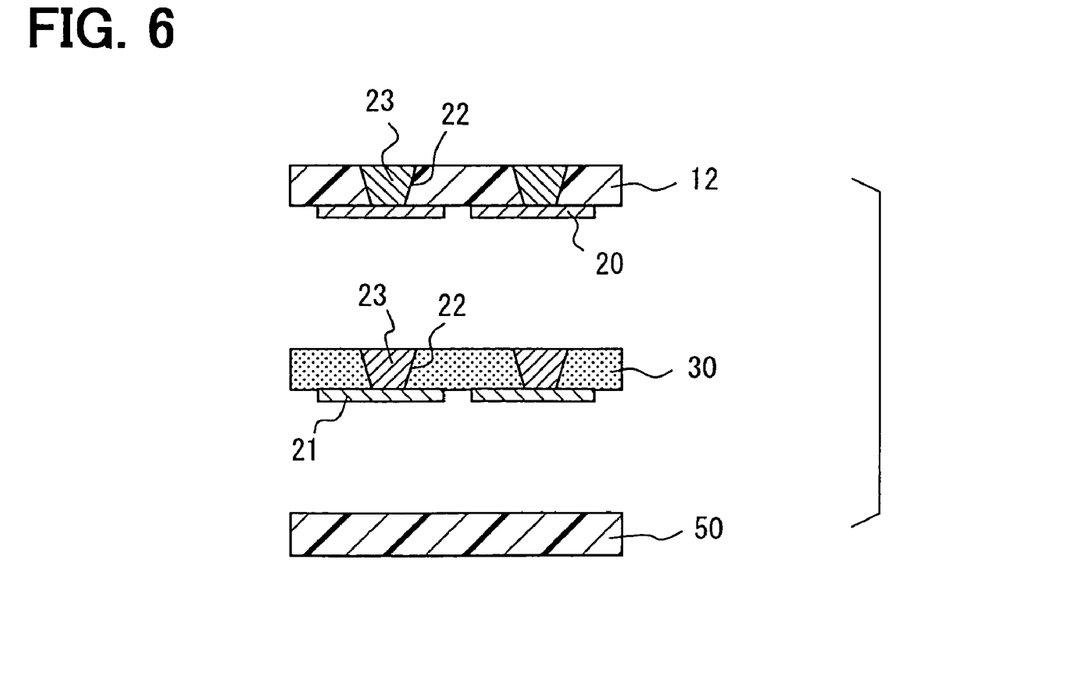
FIG. 6 is a schematic sectional view showing respective films in a preparing step, according to a manufacturing method of a printed board of the second embodiment.

FIG. 6 is a schematic sectional view showing respective films in a preparing step of the second embodiment. Furthermore, 7A shows a laminating step, FIG. 7B shows a pressing-heating step, and FIG. 7C shows an opening portion forming step.

In the second embodiment, as an example, the printed board 100 is formed by laminating six resin films in total, and only a conductor pattern 20 is formed at one side of the thermoplastic resin member 10. Lands 21 are respectively formed in coloring films 30 laminated and arranged on both surfaces of the thermoplastic resin member 10. That is, the coloring film 30 is arranged in the circumferential portion of each land 21. The lands 21 are electrically connected to each other by an interlayer connecting material 23 filled within a via hole 22. An unillustrated conductor pattern 20 can be formed on the surface of the coloring film 30 except for the land 21.

Further, in this embodiment, transmitting films 50 having a light transmittance higher than that of the coloring film 30 are laminated and arranged on the land forming faces of the coloring films 30, and are bonded (melted) to the coloring films 30. An opening portion 51 is provided correspondingly to each land 21 so as to expose only a part of each land 21.

As the transmitting film 50, it is possible to use a transmitting film having a light transmittance higher than that of the coloring film 30 and able to transmit one portion of received light and make this one portion reach until the land forming face of the coloring film 30. In this embodiment, LCP of about 50 μm in thickness can be used.

Thus, in accordance with the structure of the printed board 100 shown in the second embodiment, at least a part of light passing through the transmitting film 50 is absorbed by the coloring film 30. That is, because light reflectivity in the circumferential portion of the land 21 is reduced due to the transmitted film 50, the recognizing ratio of the land 21 can be improved.

Further, the land forming face of the coloring film 30 except for a portion of the land 21, exposed by the opening portion 51, is covered with the transmitting film 50. Accordingly, as shown in this embodiment, it is not necessary to separately form a solder resist even in a structure having the conductor pattern except for the land 21 on the land forming face.

Further, in this embodiment, the thermoplastic resin member 10, the coloring films 30 and the transmitting films 50 are constructed with the same material (LCP). In accordance with such a structure, the connection reliability between the thermoplastic resin member 10, the coloring films 30 and the transmitting films 50 can be effectively improved. In this embodiment, the transmitting film 50 having high light transmittance can be set by thinly setting the thickness of a resin film, and the coloring film 30 can be formed by coloring this resin film.

Next, one example of a method for manufacturing the printed board 100 of the above structure will be described.

As shown in FIG. 6, each film is first prepared. Similar to the first embodiment, a resin film 12 is prepared to construct the thermoplastic resin member 10. Further, lands 21 are formed on a coloring film 30, and via holes 22 filled with electrically conductive paste (23) as an interlayer connecting material 23 is formed. Further, a transmitting film 50 constructed with the same material as the resin film 12 and having a thickness approximately equal to that of the resin film 12 is prepared.

Figure 7A:
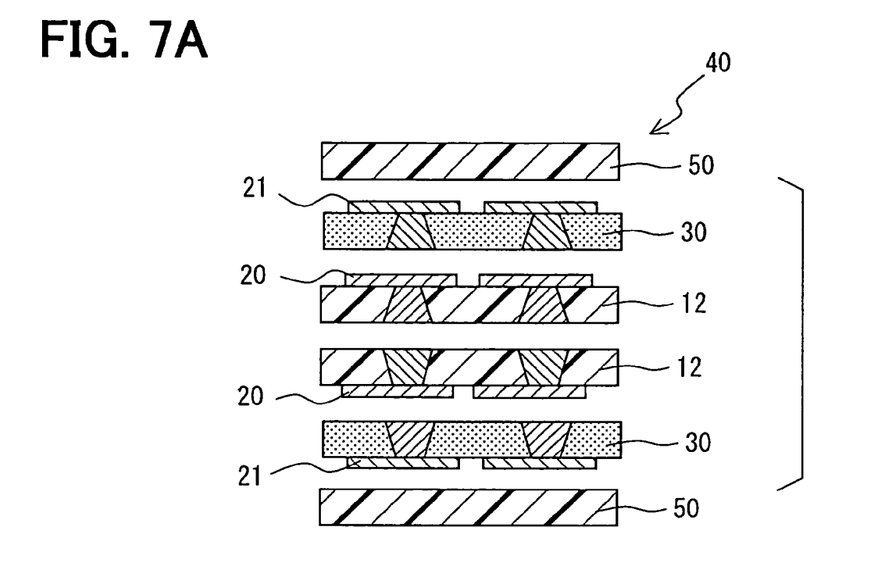
Figure 7B:
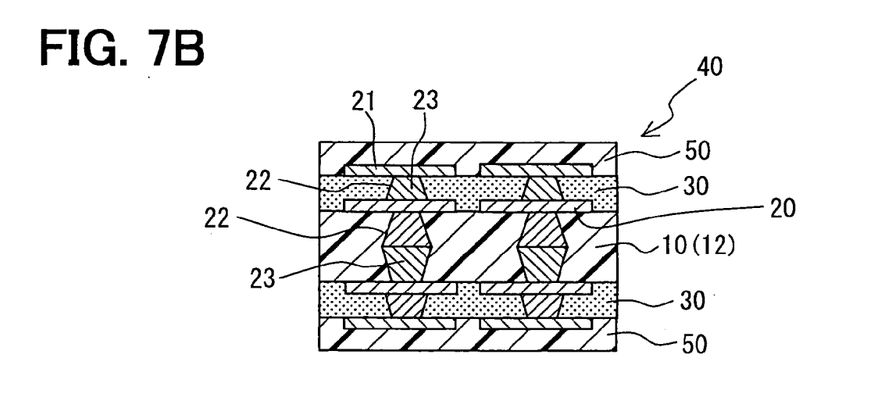
Figure 7C:
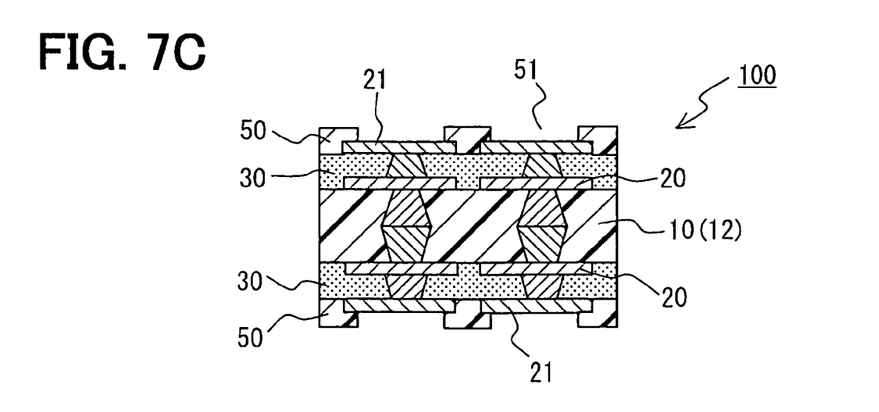

Then, as shown in FIG. 7A, plural resin films 12 (two resin films 12 in this example), two coloring films 30 and two transmitting films 50 are laminated so that a laminating body 40 is formed. At this time, the lamination is performed such that the transmitting films 50 become both outside surface layers, and the lands 21 contact the transmitting films 50. Furthermore, a face for forming the conductor pattern 20 and the land 21 is arranged on the upper side, and a face for forming the conductor pattern 20 and the land 21 is arranged on the lower side in the lamination. In FIG. 7A, for convenience, the respective films 12, 30, 50 are separately illustrated.

Thus, because no both-face substrate is also used in this embodiment, a manufacturing equipment and a manufacturing process can be simplified, which can contribute to a reduction in manufacture cost. Further, because the lands 21 are exposed on both the upper and lower surfaces of the printed board 100 (described later), high density mounting or compactness of the printed board 100 can be obtained. In addition to this, the lamination can be also performed so as to expose the land 21 on only one surface of the laminating body 40.

After the laminating process, a pressurizing-heating step for heating the laminating body 40 while pressuring the laminating body 40 from both its upper and lower surfaces by an unillustrated hot press machine (e.g., 250 to 400° C., 1 to 10 MPa and several ten seconds) is performed. As a result, as shown in FIG. 7B, the respective resin films 12, 30, 50 are softened and bonded to each other so that the integrated laminating body 40 is formed. Further, the electrically conductive paste (23) within the via holes 22 is sintered so that integrated electrically connecting material 23 is formed. Further, the electrically conductive paste (23) is further diffused and joined to the adjacent conductor pattern 20 and land 21. In this state shown in FIG. 7B, the land forming surface including the lands 21 of the coloring films 30 are covered with the transmitting films 50.

As shown in FIG. 7C, an opening portion forming step for forming the opening portions 51 in the transmitting films 50 is performed by a cooling process after the hot press. In this embodiment, similar to the opening portion 31 of the first embodiment, the opening portion 51 can be formed by using a laser so as not to damage the land 21, and no land 21 is perfectly exposed and its peripheral edge portion is pressed by the transmitting film 50. Accordingly, separation of the land 21 from the coloring film 30 can be restricted. The printed board 100 shown in this embodiment can be formed by the above processes.

This embodiment shows an example in which the printed board 100 is constructed with the two resin films 12, the two coloring films 30 and the two transmitting films 50. However, when the printed board 100 is constructed so that the lands 21 are exposed on both faces, the number of resin films 12 is not limited to the above example. Further, a structure for exposing the land 21 on only one face may be also set. For example, a structure using one resin film 12, one coloring film 30 and one transmitting film 50 can be set as a minimum structure.

Further, this embodiment shows an example in which the opening portion forming step is performed after the pressuring-heating process. However, as shown in the modification example of the first embodiment shown in FIG. 4A-4D, the opening portion forming step may be also performed before the laminating process.

Further, this embodiment shows an example in which the resin material of each of the films 12, 30, 50 is the same (e.g., LCP of 50 μm in thickness). In accordance with such a structure, the connection reliability of each of the films 12, 30, 50 can be improved. However, the respectively films 12, 30, 50 can be also formed from different materials.

Further, this embodiment shows an example in which the laminating body 40 is formed by laminating the respective films 12, 30, 50 and these films are collectively bonded to each other by a hot press machine. In this case, the manufacturing process can be simplified. Further, it is possible to improve the connection reliability of the conductor patterns 20, the lands 21 and the interlayer connecting materials 23 for connecting the conductor patterns to each other. However, the printed board 100 may be also formed by divisionally performing the pressurization and the heating plural times.

Figure 8:
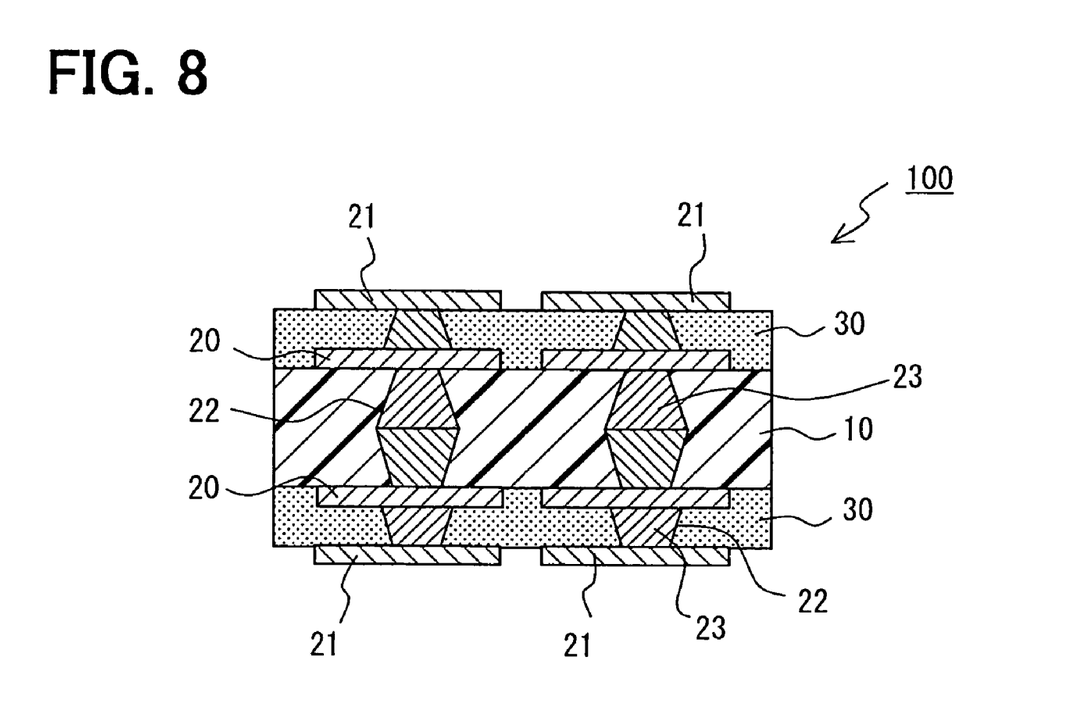
FIG. 8 is a schematic sectional view showing a printed board according to a modification of the second embodiment of the present invention.

Further, this embodiment shows an example in which the transmitting film 50 is laminated and arranged on the land forming face of the coloring film 30. However, as shown in FIG. 8, a structure having no transmitting film 50 may be also set. The coloring film 30 can be arranged in the circumferential portion of the land 21 even in the printed board 100 of such a structure. Accordingly, the recognizing ratio of the land 21 can be improved. However, when the conductor pattern except for the land 21 is formed on the land forming face of the coloring film 30, it is necessary to separately form a solder resist.

Further, in the printed board 100 shown in this embodiment and the printed board 100 shown in FIG. 8 as its modified example, the land 21 and the via hole 22 filled with the interlayer connecting material 23 are formed in/on the coloring film 30 before laminating. Accordingly, the conductor pattern including the land 21 and the via hole 22 filled with the interlayer connecting material 23 can be simply formed. In this case, when the thermoplastic resin is colored, a heat amount transmitted to the coloring film 30 is increased in the pressuring-heating process in comparison with the uncolored resin film 12. Accordingly, in this example, the pressing and heating are performed, so that a large difference is not caused in the fluidizing amount of resin, and a position shift is not caused in the conductor pattern 20 and the land 21.

Although the present invention has been described in connection with some preferred embodiments thereof with reference to the accompanying drawings, it is to be noted that various changes and modifications will become apparent to those skilled in the art.

For example, in the above-described embodiments, the liquid crystal polymer (LCP) that is a thermoplastic resin is used as a material of the films 11, 12, 30, 50 constituting the printed board 100. However, in addition to this, a thermoplastic resin film formed from 65 to 35% of polyether ether ketone (PEEK) and 35 to 65% of polyether imide (PEI) may be also used, and PEEK and PEI may be also independently used. Further, polyether sulfone (PES), polyphenylene ether (PPE), polyethylene naphthalate (PEN), styrene resin, etc. having a syndioctatic structure may be also independently used. Alternatively, one of these resins including PEEK and PEI may be also mixed and used. That is, the resin films can be bonded to each other in the heating-pressurizing process, and can be preferably used if these resin films are resin films having a heat resisting property required in soldering, etc. as a subsequent process.

Further, in the above-described embodiments, carbon black as a colored inorganic pigment is added to the coloring film 30. However, in addition to the colored inorganic pigment, it is also possible to use a material having an excellent heat resisting property and able to hold a color even during a heating while the printed board 100 is formed, and to color the thermoplastic resin.

While the invention has been described with reference to preferred embodiments thereof, it is to be understood that the invention is not limited to the preferred embodiments and structures. The invention is intended to cover various modification and equivalent arrangements. In addition, while the various elements of the preferred embodiments are shown in various combinations and configurations, which are preferred, other combinations and configuration, including more, less or only a single element, are also within the spirit and scope of the invention.

What is claimed is:

1. A printed board comprising:
   a thermoplastic resin member made of a thermoplastic resin;
   a land as an electrode, provided on a land forming surface of the thermoplastic resin member, the land forming surface being positioned on an outer surface of the thermoplastic resin member;
   a conductor pattern arranged in the thermoplastic resin member and electrically connected to the land;
   a thermoplastic resin film made of the same thermoplastic resin as the thermoplastic resin member and a carbon black, the carbon black coloring the thermoplastic resin film so as to set a difference in light reflectivity between the land and the thermoplastic resin film to be greater than a difference in light reflectivity between the land and the thermoplastic resin member, wherein:
   the thermoplastic resin film is arranged on the land forming surface of the thermoplastic resin member;
   the thermoplastic resin film has an opening portion from which at least a part of the land is exposed; and
   an amount of the carbon black included in the thermoplastic resin film is 0.01 weight % or more and 1.0 weight % or less.

2. The printed board according to claim 1, wherein the thermoplastic resin member is formed by laminating plural resin films.

3. The printed board according to claim 1, wherein:
   the thermoplastic resin member is formed by stacking plural resin films made of the thermoplastic resin and by pressing and heating the stacked thermoplastic resin member so as to form the conductor pattern in the stacked thermoplastic resin member.

4. The printed board according to claim 1, wherein:
the land forming surface is provided on each of opposite first and second surfaces of the thermoplastic resin member;
the land is provided on each of the first and second surfaces of the thermoplastic resin member; and
the land on the first surface is electrically connected to the land of the second surface via the conductor pattern.

5. The printed board according to claim 1, wherein an image recognizing defect ratio of the land is 5% or less.

6. A printed board comprising:
a thermoplastic resin member which is made of a thermoplastic resin and formed from a plurality of stacked thermoplastic resin films;
a plurality of conductor patterns arranged in the thermoplastic resin member in a multi-layer; and
a land as an electrode provided on a land forming surface of one thermoplastic resin film among the stacked thermoplastic resin films, the land forming surface being positioned on an outer surface of the one thermoplastic resin member; wherein
the one thermoplastic resin film is made of the same thermoplastic resin as that of the thermoplastic resin member and a predetermined amount of carbon black, wherein the predetermined amount of carbon black colors the one thermoplastic film so as to set a difference in light reflectivity between the land and the one thermoplastic resin film to be greater than a difference in light reflectivity between the land and other thermoplastic resin films of the thermoplastic resin member, wherein the predetermined amount of the carbon black of the one thermoplastic resin film is 0.01 weight % or more and 1.0 weight % or less.

7. The printed board according to claim 6, wherein the land forming surface of the one thermoplastic resin film is arranged as a surface layer of the stacked thermoplastic resin films, and the land is exposed from the surface of the one thermoplastic resin film.

8. The printed board according to claim 6, further comprising:
a light transmitting film made of a thermoplastic resin and having a light transmittance higher than that of the thermoplastic resin films, wherein:
the light transmitting film is arranged to contact the land forming surface of the one thermoplastic resin film; and
the light transmitting film has an opening portion from which at least a part of the land is exposed.

9. The printed board according to claim 6, wherein:
the thermoplastic resin member is formed by stacking plural resin films made of the thermoplastic resin and by pressing and heating the stacked thermoplastic resin member so as to form the conductor pattern in the stacked thermoplastic resin member.

10. The printed board according to claim 6, wherein:
the land forming surface is provided on each of opposite first and second surfaces of the thermoplastic resin member;
the land is provided on each of the first and second surfaces of the thermoplastic resin member; and
the land on the first surface is electrically connected to the land of the second surface via the conductor pattern.

11. The printed board according to claim 6, wherein an image recognizing defect ratio of the land is 5% or less.

12. A printed board comprising:
a thermoplastic resin member made of a thermoplastic resin, the thermoplastic resin member including a land forming surface positioned on an outer surface of the thermoplastic resin member;
a land as an electrode, the land disposed on the land forming surface of the thermoplastic resin member;
a conductor pattern arranged in the thermoplastic resin member and electrically connected to the land;
a thermoplastic resin film made of the same thermoplastic resin as the thermoplastic resin member and a predetermined amount of a colored inorganic pigment, wherein the predetermined amount of the colored inorganic pigment sets a difference in light reflectivity between the land and the thermoplastic resin film to be greater than a difference in light reflectivity between the land and the thermoplastic resin member, wherein the predetermined amount of the colored inorganic pigment included in the thermoplastic resin film is 0.01 weight % or more and 1.0 weight % or less, wherein the thermoplastic resin film is arranged on the land forming surface of the thermoplastic resin member and has an opening portion which exposes at least a part of the land.

13. The printed board according to claim 12, wherein the colored inorganic pigment is black.

14. The printed board according to claim 13, wherein the colored inorganic pigment is carbon black.

* * * * *